US009123858B2

(12) United States Patent
Mitsui et al.

(10) Patent No.: US 9,123,858 B2
(45) Date of Patent: Sep. 1, 2015

(54) METHOD FOR MANUFACTURING PHOTOELECTRIC CONVERSION DEVICE AND A SOLID-STATE IMAGING DEVICE HAVING A PHOTOELECTRIC CONVERSION DEVICE FORMED IN ACCORDANCE WITH THE METHOD

(71) Applicant: FUJIFILM CORPORATION, Tokyo (JP)

(72) Inventors: Tetsuro Mitsui, Kanagawa (JP); Yuki Kuramoto, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 253 days.

(21) Appl. No.: 13/851,842

(22) Filed: Mar. 27, 2013

(65) Prior Publication Data

US 2013/0206966 A1    Aug. 15, 2013

Related U.S. Application Data

(63) Continuation of application No. PCT/JP2011/068193, filed on Aug. 9, 2011.

(30) Foreign Application Priority Data

Sep. 27, 2010  (JP) ................................. 2010-216104
Aug. 2, 2011   (JP) ................................. 2011-169649
Sep. 27, 2011  (JP) ................................. 2011-211330

(51) Int. Cl.
*H01L 31/18*    (2006.01)
*H01L 27/30*    (2006.01)
*H01L 27/146*   (2006.01)

(52) U.S. Cl.
CPC .............. *H01L 31/18* (2013.01); *H01L 27/146* (2013.01); *H01L 27/307* (2013.01)

(58) Field of Classification Search
CPC ...... H01L 27/146; H01L 27/307; H01L 31/18
See application file for complete search history.

(56) References Cited

U.S. PATENT DOCUMENTS

2008/0225142 A1    9/2008  Goto
2008/0246107 A1   10/2008  Maehara (Continued)

FOREIGN PATENT DOCUMENTS

JP    2000-106223 A    4/2000
JP    2001-007367 A    1/2001

(Continued)

OTHER PUBLICATIONS

International Search Report; PCT/JP2011/068193; Oct. 25, 2011.

(Continued)

*Primary Examiner* — Francis M Legasse, Jr.
(74) *Attorney, Agent, or Firm* — Studebaker & Brackett PC

(57) ABSTRACT

A method for manufacturing a photoelectric conversion device including a first process where a plurality of pixel electrodes are formed on a dielectric layer; a second process where a light receiving layer that includes an organic material is formed on the plurality of pixel electrodes; and a third process where a counter electrode is formed on the light receiving layer. The first process includes a film forming process of a pixel electrode material on the dielectric layer; a patterning process of the film of the pixel electrode material; and a heating process for heating the substrate at 270° C. after the patterning process. Such process forming a photoelectric conversion device of a solid-state imaging device which also includes a signal reading circuit formed on the substrate, the signal reading circuit capable of reading out the signal according to a quantity of electric charges collected in the first electrode.

9 Claims, 2 Drawing Sheets

(56) References Cited

U.S. PATENT DOCUMENTS

| | | | | |
|---|---|---|---|---|
| 2010/0147379 A1* | 6/2010 | Kishimoto | ............... | 136/258 |
| 2012/0037787 A1 | 2/2012 | Kitada et al. | | |
| 2012/0064664 A1* | 3/2012 | Yamazaki et al. | ............ | 438/104 |

FOREIGN PATENT DOCUMENTS

| JP | 2005-085933 A | 3/2005 |
|---|---|---|
| JP | 2006-127782 A | 5/2006 |
| JP | 2008-072435 A | 3/2008 |
| JP | 2008-072589 A | 3/2008 |
| JP | 2008-252004 A | 10/2008 |
| JP | 2008-258421 A | 10/2008 |
| JP | 2008-263178 A | 10/2008 |
| JP | 2009-105336 A | 5/2009 |

OTHER PUBLICATIONS

An Office Action; "Notification of Reasons for Refusal," issued by the Japanese Patent Office on Apr. 8, 2014, which corresponds to Japanese Patent Application No. 2011-211330 and is related to U.S. Appl. No. 13/851,842; with English language translation.

\* cited by examiner

METHOD FOR MANUFACTURING PHOTOELECTRIC CONVERSION DEVICE AND A SOLID-STATE IMAGING DEVICE HAVING A PHOTOELECTRIC CONVERSION DEVICE FORMED IN ACCORDANCE WITH THE METHOD

TECHNICAL FIELD

The present invention relates to a method for manufacturing a photoelectric conversion device, a solid-state imaging device and an imaging apparatus.

BACKGROUND ART

For a conventional solid-state imaging device having a photodiode in a semiconductor substrate, minimization of a pixel size reaches its limit, making it difficult to improve performance such as sensitivity and the like. Accordingly, there has been suggested a solid-state imaging device which is highly sensitive stack type, and enables to obtain 100% aperture ratio by installing a photoelectric conversion layer on the upper part of a semiconductor substrate (Patent Document 1).

The stack type solid-state imaging device as disclosed in Patent Document 1 has a constitution where a plurality of pixel electrodes are arrayed on the upper part of a semiconductor device, a light receiving layer which includes an organic material (including at least a photoelectric conversion layer) is formed on the upper part of the plurality of pixel electrodes, and a counter electrode is formed on the upper part of the light receiving layer. The solid-state imaging device applies an electric field to the light receiving layer by applying a bias voltage to the counter electrode, and transfers the electric charge generated in the light receiving layer to the pixel electrode. Then, the stack type solid-state imaging device reads out a signal corresponding to the electric charge by a reading circuit which is connected to the pixel electrode.

In the stack type solid-state imaging device, after a pixel electrode, a light receiving layer and a counter electrode are formed, a protective film, a color filter, other functional films and the like may be formed on the upper part thereof in some cases so as to block the outside air (water and oxygen). In the case of a color filter, for example, along with a process of applying chemicals, a heating process is generally performed at 200° C. with respect to the light receiving layer for curing.

In addition, the heating process is also performed in cases of wire bonding for electrically connecting a circuit board and a package, a die bonding of a chip for package and reflow soldering for connecting a package to an IC substrate. Further, for the wire bonding, it is required to install a PAD opening on the periphery of a chip and the like, and in this case, forming a registor pattern or etching is performed, and at each process, heating process is performed for the substrate where a light receiving layer is formed.

As described above, in the case of manufacturing a solid-state imaging device using a light receiving layer that includes an organic material, a high-temperature heating process is required when adopting a processing method used in a conventional silicon device. A light receiving layer is required to be resistant to such heating process.

As a method for improving heat resistance of a light receiving layer, it is common to use a material having a little heat change (for example, a material having a high glass transition Tg). However, a light receiving layer is also required to have properties such as high photoelectric conversion efficiency and a low dark current, in addition to heat resistance. Accordingly, it is necessary to choose a material that satisfies those properties and heat resistance, which narrows the choice range of a material of a light receiving layer.

As described above, many methods have been suggested to improve heat resistance of a light receiving layer. However, it has not been known to improve heat resistance with the focus on other constituent elements than a light receiving layer.

Further, not only a solid-state imaging device, but also other devices such as a solar cell using a light receiving layer have the problem of heat resistance if the heating process is performed after a light receiving layer is formed.

Patent Documents 2 and 4 disclose a method for manufacturing a photoelectric conversion device in which an ITO film is formed on a glass substrate by a sputtering method, and after patterning is performed to form a pixel electrode, the substrate is heated and dried at 250° C., and then a light receiving layer and a counter electrode are formed.

However, the manufacturing method only provides heating at 250° C. for drying the ITO pixel electrode, without the aim of improving heat resistance. In addition, the method does not describe the specific range of temperatures for improving heat resistance of a photoelectric conversion device having a light receiving layer that includes an organic material.

Moreover, Patent Document 5 describes a thin film solar cell in which after Ag electrode is formed on a polyimide substrate, heating is performed at 230° C. before forming an a-Si photoelectric conversion layer.

However, the method relates to an inorganic solar cell, and does not describe the specific range of temperatures for improving heat resistance of a photoelectric conversion device having a light receiving layer that includes an organic material.

RELATED ART

Patent Document

Patent Document 1: Japanese Patent Application Laid-Open No. 2008-263178
Patent Document 2: Japanese Patent Application Laid-Open No. 2005-085933
Patent Document 3: Japanese Patent Application Laid-Open No. 2008-072435
Patent Document 4: Japanese Patent Application Laid-Open No. 2008-072589
Patent Document 5: Japanese Patent Application Laid-Open No. 2001-007367

DISCLOSURE OF INVENTION

Problems to be Solved by the Invention

The present invention has been made in consideration of the aforementioned circumstances, and for a photoelectric conversion device having a light receiving layer that includes an organic material, the object of the present invention is to provide a method for manufacturing a photoelectric conversion device capable of improving heat resistance irrespective of a material of a light receiving layer. Further, it is another object of the present invention to provide a solid-state imaging device that includes a photoelectric conversion device manufactured by the manufacturing method, and an imaging apparatus that includes the solid-state imaging device.

Means for Solving the Problems

The present invention relates to a method for manufacturing a photoelectric conversion device which includes: a first electrode in which a dielectric film composed of an oxide film is formed on a substrate, the first electrode which includes a conductive material formed on the dielectric film; a light receiving layer that includes an organic material formed on the first electrode; and a second electrode formed on the light receiving layer, in which the method includes: a first process for forming the first electrode on the dielectric film; a second process for forming the light receiving layer on the first electrode; a third process for forming the second electrode on the light receiving layer; and a heating process for heating the substrate at 270° C. or above, the heating process performed before the second process and after the first process.

The solid-state imaging device of the present invention is provided with the photoelectric conversion device manufactured by the aforementioned method for manufacturing the photoelectric conversion device, and a signal reading circuit that is formed on the substrate and reads out a signal corresponding to a quantity of electric charges generated in the light receiving layer and collected in the first electrode.

The imaging apparatus of the present invention includes the solid-state imaging device.

Advantageous Effects of Invention

According to the present invention, in the photoelectric conversion device having the light receiving layer that includes an organic material, it is possible to provide a method for manufacturing the photoelectric conversion device capable of improving heat resistance irrespective of a material of the light receiving layer. Further, it is possible to provide a solid-state imaging device having the photoelectric conversion device manufactured by the manufacturing method and an imaging apparatus having the solid-state imaging device.

EMBODIMENTS FOR CARRYING OUT THE INVENTION

Figure 1:
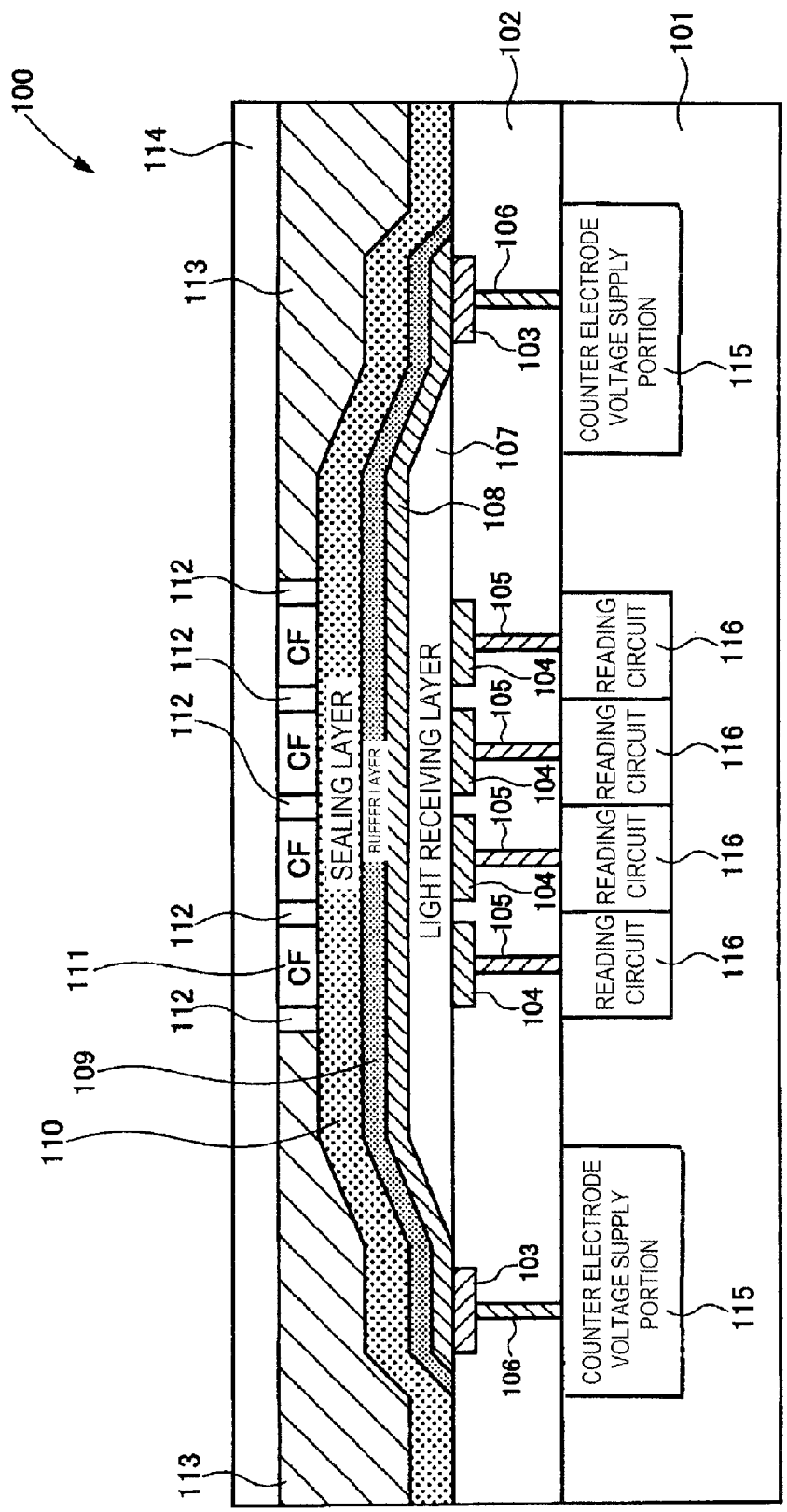
FIG. 1 is a cross-sectional view schematically illustrating the constitution of a solid-state imaging device according to an exemplary embodiment of the present invention.

Hereinafter, the present invention will be described in detail with reference to drawings.

After inventors' review of the improvement of heat resistance for the photoelectric conversion device having a pixel electrode formed on the upper part of the substrate, a light receiving layer including an organic material and formed on the pixel electrode and a counter electrode formed on the light receiving layer, it was found out that by performing a substrate heating process at 270° C. or above before forming the light receiving layer and after the pixel electrode is formed, heat resistance of the photoelectric conversion device is improved irrespective of a constitution of the light receiving layer.

Further, in the substrate heating process, the upper limit of the substrate heating temperature is 800° C. When the temperature exceeds the limit, in the case where oxygen is present in the environment of the heating process, the pixel electrode reacts with oxygen, and as a result, the pixel electrode becomes an insulator. More preferred range of heating temperature is from 280° C. to 800° C., and still more preferred range is from 350° C. to 800° C.

Although the reason why the substrate heating process improves heat resistance is not obvious, it is assumed that when forming the light receiving layer without performing the substrate heating process, the pixel electrode, which acts on the light receiving layer in the heating process later performed for the photoelectric conversion device, is deteriorated, and as a result, performance is deteriorated.

Further, the heating process which is performed later for the photoelectric conversion device refers to a color filter curing, wire bonding, die bonding and reflow soldering which are performed after the counter electrode is formed, and a high temperature heating process (generally a heating process at 200° C. to 220° C.) which is performed when a PAD opening is formed.

In the heating process which is performed later for the photoelectric conversion device, it is assumed that oxygen is introduced from an oxide film under the pixel electrode (for example, an $SiO_2$ film) to the pixel electrode. As a result, the light receiving layer is affected by a very small amount of gas flowing from the pixel electrode and the like, which accelerates deformation of the light receiving layer and generates a leakage, or changes a composition of the pixel electrode such that electrical connection of the pixel electrode and the light receiving layer is changed, thereby deteriorating heat resistance.

Further, it is also assumed that in the film forming process of a pixel electrode material or a patterning process of a pixel electrode (photolithography and etching process), contamination components (for example, residual components such as gas used in an organic solvent or a film forming process), which are adsorbed or introduced on the surface or inner side of the pixel electrode, are volatilized from the surface or inner side of the pixel electrode in the heating process performed later for the photoelectric conversion device, thereby having an adverse effect on the light receiving layer formed on the pixel electrode, and deteriorating heat resistance.

It is thought that in the case of having the substrate heating process, gas or contamination components, which adversely affect the light receiving layer, can be volatilized in advance from the surface and inner side of the pixel electrode. As a result, in the heating process performed later for the photoelectric conversion device, leakage of gas from the pixel electrode or volatilization of contamination components from the pixel electrode are prevented, thereby improving heat resistance of the photoelectric conversion device.

Hereinafter, an exemplary embodiment of the solid-state imaging device using the photoelectric conversion device having the light receiving layer that includes an organic material will be described.

FIG. 1 is a cross-sectional view schematically illustrating the constitution of a solid-state imaging device according to an exemplary embodiment of the present invention. The solid-state imaging device is used by being mounted in the imaging apparatus such as a digital camera, a digital video camera, an electronic endoscope apparatus and a mobile phone with a camera.

A solid-state imaging device 100 illustrated in FIG. 1 includes a substrate 101, a dielectric layer 102, a connection electrode 103, a pixel electrode 104, a connection portion 105, a connection portion 106, a light receiving layer 107, a counter electrode 108, a buffer layer 109, a sealing layer 110, a color filter 111, a partition wall 112, a light-shielding layer 113, a protection layer 114, a counter electrode voltage supply portion 115 and a reading circuit 116.

The substrate 101 is a glass substrate or a semiconductor substrate such as Si. The dielectric layer 102, which is composed of silicon oxide, is formed on the substrate 101. A plurality of pixel electrodes 104 are formed side by side on the surface of the dielectric layer 102. The connection portion 105 is formed in the dielectric layer 102 to correspond to each of the plurality of pixel electrodes 104.

The light receiving layer 107 is a layer that includes an organic material and is constituted by at least a photoelectric conversion layer. The photoelectric conversion layer generates electric charges according to the received light. The light receiving layer 107 is provided to cover the plurality of pixel electrodes 104 and formed thereon. The light receiving layer 107 is formed in a predetermined thickness, but the thickness may be changed in a region other than an effective pixel region where the pixel electrodes 104 are disposed. The light receiving layer 107 will be described in detail below. Further, the light receiving layer 107 includes not only a layer which is composed only of an organic material, but also a layer a part of which is composed of an inorganic material.

The counter electrode 108 is an electrode facing the pixel electrodes 104, and is installed on the light receiving electrode 107 to cover the light receiving electrode 107. The counter electrode 108 is formed up to the top of the connection electrode 103 disposed at the outer side of the light receiving layer 107 and is electrically connected to the connection electrode 103.

The counter electrode 108 is preferably composed of a transparent conductive film to allow light to be incident on the light receiving layer 107 that includes the photoelectric conversion layer. Examples of the material of the transparent conductive film may include metal, metal oxides, metal nitrides, metal borides, an organic conductive compound, a mixture thereof and the like.

Specific examples thereof may include conductive metal oxides such as tin oxide, zinc oxide, indium oxide, indium tin oxide (ITO), indium zinc oxide (IZO), indium tungsten oxide (IWO), and titanium oxide, metal nitrides such as titanium nitride (TiN), metal such as gold (Au), platinum (Pt), silver (Ag), chromium (Cr), nickel (Ni), aluminum (Al), mixtures or laminates of the metals and the conductive metal oxides, organic conductive compounds such as polyaniline, polythiophene, and polypyrrole, laminates of the organic conductive compounds and ITO and the like.

Particularly preferable examples of the material of the transparent conductive film include any one material of ITO, IZO, TiN, tin oxides, antimony-doped tin oxides (ATO), fluorine-doped tin oxides (FTO), zinc oxides, antimony-doped zinc oxides (AZO) and gallium-doped zinc oxides (GZO).

The connection portion 106 is buried in the dielectric layer 102. The connection portion 106 is composed of a plug and the like to electrically connect the connection electrode 103 and the counter electrode voltage supply portion 115.

The counter electrode voltage supply portion 115 is formed on the substrate 101. The counter electrode voltage supply portion 115 applies a predetermined voltage to the counter electrode 108 through the connection portion 106 and connection electrode 103.

In the case where the voltage to be applied to the counter electrode 108 is higher than a power voltage of the solid-state imaging device 100, the counter electrode voltage supply portion 115 supplies a predetermined voltage by increasing a power voltage by a voltage increasing circuit such as a charge pump.

The pixel electrode 104 is an electrode for collecting electric charges generated in the light receiving layer 107 which is interposed between the pixel electrode 104 and the counter electrode 108 facing the pixel electrode. The pixel electrode 104 is composed of a conductive material. Examples of the material of the pixel electrode 104 may include at least any one of TiN (titanium nitride), TiON (titanium oxide nitride), W, Cr, ITO, Al, Cu, AlCu. Particularly preferable material is ITO, TiON and TiN.

The reading circuit 116 is installed on the substrate 101 to correspond to each of the plurality of pixel electrodes 104, and reads out the signals according to the electric charges collected in the corresponding pixel electrode 104.

The reading circuit 116 is constituted by, for example, a CCD, an MOS circuit or a TFT circuit, and is light-shielded by a light-shielding layer (not shown) disposed in the dielectric layer 102. The reading circuit 116 and the pixel electrode 104 corresponding thereto are electrically connected through the connection portion 105.

The buffer layer 109 is formed on the counter electrode 108 to cover the counter electrode 108.

The sealing layer 110 is formed on the buffer layer 109 to cover the buffer layer 109.

The color filter 111 is formed at a position facing each of the pixel electrodes 104 on the sealing layer 110.

The partition wall 112 is installed between the color filters 111 to improve light transmittance efficiency of the color filters 111.

The light-shielding layer 113 is formed in a region other than a region where the color filter 111 and the partition wall 112 are installed on the sealing layer 110. The light-shielding layer 113 prevents light from being incident on the light receiving layer 107 formed in a region other than an effective pixel region.

The protection layer 114 is formed on the color filter 111, the partition wall 112 and the light-shielding layer 113, and protects the entire solid-state imaging device 100.

Further, in FIG. 1, the pixel electrode 104 and the connection electrode 103 are buried in the surface portion of the dielectric layer 102, but the pixel electrode 104 and the connection electrode 103 may be formed on the dielectric layer 102.

In addition, the connection electrode 103, the connection portion 106 and the counter electrode voltage supply portion 115 are installed as a plurality of sets, but only one set thereof may be installed. As illustrated in FIG. 1, a voltage drop in the counter electrode 108 may be suppressed by supplying voltage from both ends of the counter electrode 108 to the counter electrode 108. The number of sets may be increased or decreased in consideration of a chip size of a device.

Hereinafter, a preferred constitution of the light receiving layer will be described.

Figure 2:
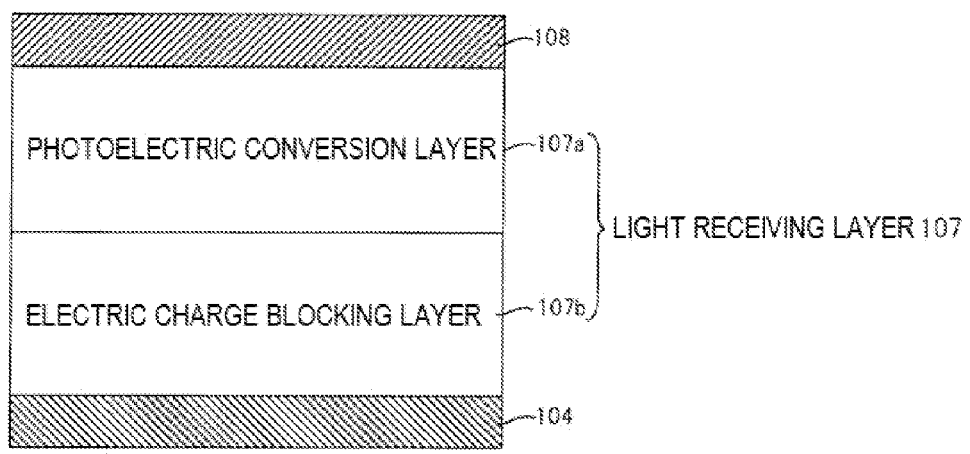
FIG. 2 is a cross-sectional view illustrating the preferred example of a light receiving layer in the solid-state imaging device shown in FIG. 1.

FIG. 2 is a cross-sectional view illustrating an exemplary embodiment of the light receiving layer 107. As illustrated in FIG. 2, the light receiving layer 107 includes an electric charge blocking layer 107b which is installed at the side of the pixel electrode 104, and a photoelectric conversion layer 107a which is installed thereon. The position of the electric charge blocking layer 107b and that of the photoelectric conversion layer 107a may be reversed.

The electric charge blocking layer 107b has a function of suppressing dark current. The electric charge blocking layer may be constituted by a plurality of layers. By having the electric charge blocking layer constituted by a plurality of layers, an interface is formed between the plurality of electric charge blocking layers. As discontinuity occurring at a mid-level present in each layer makes it difficult to move electric charge carriers through the mid-level, it is possible to strongly suppress the dark current.

The photoelectric conversion layer 107a includes a p-type organic semiconductor and an n-type organic semiconductor. By forming a donor-acceptor interface with the junction of p-type organic semiconductor and an n-type organic semiconductor, it is possible to increase an exciton dissociation efficiency. Accordingly, the photoelectric conversion layer 107a having a junction of the p-type organic semiconductor and the n-type organic semiconductor exhibits a high photoelectric conversion efficiency. Specifically, the photoelectric conversion layer 107a having a combination of the p-type organic semiconductor and the n-type organic semiconductor is preferable in that a junction interface is increased and photoelectric conversion efficiency is improved.

The p-type organic semiconductor (compound) is a donor-type organic semiconductor, mainly represented by a hole transporting organic compound, and an organic compound having a property of easily donating electrons. More specifically, the p-type organic semiconductor is an organic compound having a lower ionization potential when two organic materials are used in contact with each other. Accordingly, the donor-type organic compound may be any organic compound as long as the organic compound is an electron-donating organic compound. For example, a metal complex having a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, merocyanine compound, an oxonol compound, a polyamine compound, an indole compound, a pyrrole compound, a pyrazole compound, a polyarylene compound, a condensed aromatic carbon ring compound (a naphthalene derivative, an anthracene derivative, a phenanthrene derivative, a tetracene derivative, a pyrene derivative, a perylene derivative, and a fluoranthene derivative), or a heterocyclic compound containing nitrogen as a ligand and like may be used. Further, the examples are not limited thereto, and any organic compound may be used as a donor-type organic semiconductor as long as the organic compound is an organic compound having the ionization potential that is lower than that of the organic compound used as the n-type (acceptor-type) compound.

The n-type organic semiconductor (compound) is an acceptor-type organic semiconductor, mainly represented by an electron transporting organic compound, and an organic compound having a property of easily receiving electrons. More specifically, the n-type organic semiconductor is an organic compound having a higher electron affinity when two organic materials are used in contact with each other. Accordingly, the acceptor-type organic compound may be any organic compound as long as the organic compound is an electron-receiving organic compound. For example, a metal complex having a condensed aromatic carbon ring compound (a naphthalene derivative, an anthracene derivative, a phenanthrene derivative, a tetracene derivative, a pyrene derivative, a perylene derivative, and a fluoranthene derivative), a 5-membered to 7-membered heterocyclic compound containing a nitrogen atom, an oxygen atom and a sulfur atom (for example, pyridine, pyrazine, pyrimidine, pyridazine, triazine, quinoline, quinoxaline, quinazoline, phthalazine, sinoline, isoquinoline, pteridin, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridizine, triazolopyrimidine, tetrazaindene, oxadiazole, imidazolephridine, pyrrolidine, pyrrolopyridine, thiadiazolopyridine, dibenzazepine, tribenzazepine and the like), a polyarylene compound, a fluorine compound, a cyclopentadiene compound, a silyl compound, or a heterocyclic compound containing nitrogen as a ligand and like may be used. Further, the examples are not limited thereto, and any organic compound may be used as an acceptor-type organic semiconductor as long as the organic compound is an organic compound having a higher electron affinity than that of the organic compound used as the p-type (donor-type) organic semiconductor.

Any organic pigment may be used as the p-type organic semiconductor or the n-type organic semiconductor material, but preferably, may include a cyanine pigment, a styryl pigment, a hemicyanine pigment, a merocyanine pigment (including zeromethine merocyanine (simple merocyanine)), a trinuclear merocyanine pigment, a tetra-nuclear merocyanine pigment, a laudacyanine pigment, a complex cyanine pigment, a complex merocyanine pigment, an allophore pigment, an oxonol pigment, a hemioxonol pigment, a squarylium pigment, a croconium pigment, an azamethine pigment, a coumarin pigment, an arylidene pigment, an anthraquinone pigment, a triphenylmethane pigment, an azo pigment, an azomethine pigment, a spiro compound, a metallocene pigment, a fluorenone pigment, a fulgide pigment, a perylene pigment, a perinone pigment, a phenazine pigment, a phenothiazine pigment, a quinone pigment, a diphenylmethane pigment, a polyene pigment, an acridine pigment, an acrydinone pigment, a diphenylamine pigment, a quinacrydone pigment, a quinaphthalone pigment, a phenoxazine pigment, a phthaloperylene pigment, a diketopyrrolopyrrole pigment, a dioxane pigment, a porphyrine pigment, a chlorophyll pigment, a phthalocyanine pigment, a metal complex pigment, and a condensed aromatic carbon ring-based pigment (a naphthalene derivative, an anthracene derivative, a phenanthrene derivative, a tetracene derivative, a pyrene derivative, a perylene derivative, and a fluoranthene derivative).

As the n-type organic semiconductor, it is particularly preferred to use a fullerene or a fullerene derivative having an excellent electron transport property. The fullerene refers to fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerene and fullerene nanotubes, and the fullerene derivative refers to a compound where substituents are added thereto.

The photoelectric conversion layer 107a may include a fullerene or a fullerene derivative to rapidly transport the electric charges generated by photoelectric conversion via fullerene molecules or fullerene derivative molecules to the pixel electrode 104 or the counter electrode 108. If the fullerene molecules or the fullerene derivative molecules are connected to form a path of electrons, an electron transport property is improved, thus implementing a high-speed response of the organic photoelectric conversion device. To this end, it is preferable that fullerene or the fullerene derivative is included in the photoelectric conversion layer 107a at a volume ratio of 40% or more. However, if the fullerene or the fullerene derivative is included in an excessive amount, the amount of the p-type organic semiconductor is reduced, and a junction interface is reduced, thereby decreasing an exciton dissociation efficiency.

In the photoelectric conversion layer 107a, it is particularly preferred to use a triarylamine compound as the p-type organic semiconductor to be mixed with the fullerene or the fullerene derivative as described in Japanese Patent No. 4213832 and the like, because it is possible to achieve a high SN ratio of the organic photoelectric conversion device. If the ratio of fullerene or the fullerene derivative in the photoelectric conversion layer 107a is excessively high, the amount of the triarylamine compound is reduced, such that an absorption quantity of incident light is reduced. As a result, the photoelectric conversion efficiency is reduced, and accordingly, it is preferred that the ratio of the content of fullerene or the fullerene derivative included in the photoelectric conversion layer 4 is 85% by volume or less.

It is preferable that the p-type organic semiconductor used in the photoelectric conversion layer 107a is a compound represented by the following Formula (1).

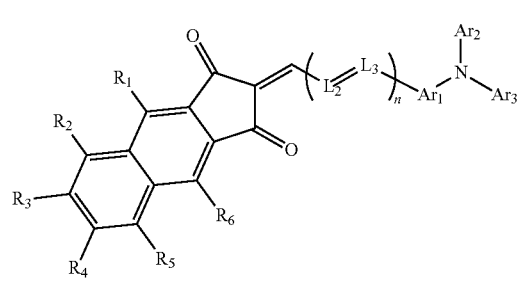

(1)

(wherein $L_2$ and $L_3$ each independently represent a methine group. n represents an integer of 0 to 2. $Ar_1$ represents a divalent substituted arylene group or an unsubstituted arylene group. $Ar_2$ and $Ar_3$ each independently represent a substituted aryl group, an unsubstituted aryl group, a substituted alkyl group, an unsubstituted alkyl group, a substituted heteroaryl group, or an unsubstituted heteroaryl group. Further, $R_1$ to $R_6$ each independently represent a hydrogen atom, a substituted alkyl group, an unsubstituted alkyl group, a substituted aryl group, an unsubstituted aryl group, a substituted heteroaryl group, or an unsubstituted heteroaryl group, and any of adjacent $R_1$ to $R_6$ may be bonded to each other to form a ring.)

The arylene group represented by $Ar_1$ is preferably an arylene group having 6 to 30 carbon atoms, and more preferably an arylene group having 6 to 18 carbon atoms. The arylene group may be substituted, and preferably an arylene group having 6 to 18 carbon atoms which may have an alkyl group having 1 to 4 carbon atoms. Examples thereof may include a phenylene group, a naphthylene group, a methylphenylene group, a dimethylphenylene group and the like, and a phenylene group or a naphthylene group is preferable, and a phenylene group is more preferable.

Each of the aryl groups represented by $Ar_2$ and $Ar_3$ is independently preferably an aryl group having 6 to 30 carbon atoms and more preferably an aryl group having 6 to 18 carbon atoms. The aryl group may be substituted, and preferably an aryl group having 6 to 18 carbon atoms which may have an alkyl group having 1 to 4 carbon atoms or an aryl group having 6 to 18 carbon atoms. Examples thereof may include a phenyl group, a naphthyl group, a tolyl group, an anthryl group, a dimethylphenyl group, a biphenyl group and the like, and a phenyl group or a naphthyl group is preferred. n is preferably 0 or 1.

The alkyl group represented by $Ar_2$ and $Ar_3$ is preferably an alkyl group having 1 to 6 carbon atoms, and more preferably an alkyl group having 1 to 4 carbon atoms. Examples thereof include a methyl group, an ethyl group, n-propyl group, an isopropyl group, an n-butyl group, an isobutyl group and a t-butyl group, and a methyl group or an ethyl group is preferred, and a methyl group is more preferred.

Each of the heteroaryl group represented by $Ar_2$ and $Ar_3$ is independently preferably a heteroaryl group having 3 to 30 carbon atoms, and more preferably a heteroaryl group having 3 to 18 carbon atoms. The heteroaryl group may be substituted, and preferably a heteroaryl group having 3 to 18 carbon atoms which may have an alkyl group having 1 to 4 carbon atoms or an aryl group having 6 to 18 carbon atoms. In addition, the heteroaryl group represented by $Ar_2$ and $Ar_3$ may be a condensed ring structure, and preferably a condensed ring structure of a combination of rings selected from a furan ring, a thiophene ring, a selenophene ring, a silole ring, a pyridine ring, pyrazine ring, a pyrimidine ring, an oxazole ring, a thiazole ring, a triazole ring, a oxadiazole ring and a thiadiazole ring (the rings may be the same as each other). A quinoline ring, an isoquinoline ring, a benzothiophene ring, a dibenzothiophene ring, a thienothiophene ring, a bithienobenzene ring and a bithienothiophene ring are preferred.

The alkyl group represented by $R_1$ to $R_6$ is preferably an alkyl group having 1 to 6 carbon atoms, and more preferably an alkyl group having 1 to 4 carbon atoms. Examples thereof include a methyl group, an ethyl group, n-propyl group, an isopropyl group, an n-butyl group, an isobutyl group and a t-butyl group, and a methyl group or an ethyl group is preferred, and a methyl group is more preferred.

n is preferably 0 or 1.

Each of the heteroaryl group represented by $R_1$ to $R_6$ is independently preferably a heteroaryl group having 3 to 30 carbon atoms, and more preferably a heteroaryl group having 3 to 18 carbon atoms. The heteroaryl group may be substituted, and preferably a heteroaryl group having 3 to 18 carbon atoms which may have an alkyl group having 1 to 4 carbon atoms or an aryl group having 6 to 18 carbon atoms. In addition, a heteroaryl group containing a 5-, 6- or 7-membered ring, or a condensed ring thereof is preferred. The heteroatom contained in the heteroaryl group may include an oxygen atom, a sulfur atom and a nitrogen atom. Specific examples of the ring constituting the heteroaryl group may include a furan ring, a thiophene ring, a pyrrole ring, a pyrroline ring, a pyrrolidine ring, an oxazole ring, an isoxazole ring, a thiazole ring, an isothiazole ring, an imidazole ring, an imidazoline ring, an imidazolidine ring, a pyrazole ring, a pyrazoline ring, a pyrazolidine ring, a triazole ring, a furazan ring, a tetrazole ring, a pyran ring, a thiine ring, a pyridine ring, a piperidine ring, an oxazine ring, a morpholine ring, a thiazine ring, a pyridazine ring, a pyrimidine ring, a pyrazine ring, a piperazine ring, a triazine ring, and the like.

Examples of the condensed ring may include a benzofuran ring, an isobenzofuran ring, a benzothiophene ring, an indole ring, an indoline ring, an isoindole ring, a benzoxazole ring, a benzothiazole ring, an indazole ring, a benzimidazole ring, a quinoline ring, an isoquinoline ring, a cinnoline ring, a phthalazine ring, a quinazoline ring, a quinoxaline ring, a dibenzofuran ring, a carbazole ring, a xanthene ring, an acridine ring, a phenanthridine ring, a phenanthroline ring, a phenazine ring, a phenoxazine ring, a thianthrene ring, a thienothiophene ring, an indolizine ring, a quinolizine ring, a quinuclidine ring, a naphthyridine ring, a furin ring, a pteridine ring and the like.

Each of the aryl groups represented by $R_1$ to $R_6$ is independently preferably an aryl group having 6 to 30 carbon atoms and more preferably an aryl group having 6 to 18 carbon atoms. The aryl group may be substituted, and preferably an aryl group having 6 to 18 carbon atoms which may have an alkyl group having 1 to 4 carbon atoms or an aryl group having 6 to 18 carbon atoms. Examples thereof may include a phenyl group, a naphthyl group, an anthracenyl group, a pyrenyl group, a phenanthrenyl group, a methylphenyl group, a dimethylphenyl group, a biphenyl group and the like, and a phenyl group, a naphthyl group or an anthracenyl group is preferred.

Any of adjacent $Ar_1$, $Ar_2$, $Ar_3$ and $R_1$ to $R_6$ may be linked to each other to form a ring, and preferred examples of the formed ring may include a cyclohexene ring, a cyclopentene ring, a benzene ring, a naphthalene ring, a thiophene ring, a pyrene ring and the like.

In the case where $Ar_2$, $Ar_3$ and $R_1$ to $R_6$ have a substituent, examples of the substituent may include a halogen atom, an alkyl group (including a methyl group, an ethyl group, an n-propyl group, an isopropyl group, a t-butyl group a cycloalkyl group, a bicycloalkyl group, and a tricycloalkyl group), an alkenyl group (including a cycloalkenyl group, and a bicycloalkenyl group), an alkynyl group, an aryl group, a heterocyclic group (which may also be called a heterocyclic group), a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyl group, an aryloxycarbonyl group, an amino group (including an anylino group), an ammonio group, an acylamino group, an aminocarbonylamino group, an alkoxycarbonylamino group, an aryloxycarbonylamino group, a sulfamoylamino group, an alkyl and arylsulfonylamino group, a mercapto group, an alkylthio group, an arylthio group, a heterocyclic thio group, a sulfamoyl group, a sulfo group, an alkyl and arylsulfinyl group, an alkyl and arylsulfonyl group, an acyl group, an aryloxycarbonyl group, an alkoxycarbonyl group, a carbamoyl group, an aryl and heterocyclic azo group, an imide group, a phosphino group, a phosphinyl group, a phosphinyloxy group, a phosphinylamino group, a phosphono group, a silyl group, a hydrazino group, a ureide group, a boric acid group (—B(OH)$_2$), a phosphate group (—OPO(OH)$_2$), a sulfate group (—OSO$_3$H), and other known substituents.

Specific examples of the compound represented by Formula (1) will be described below, but the present invention is not limited thereto.

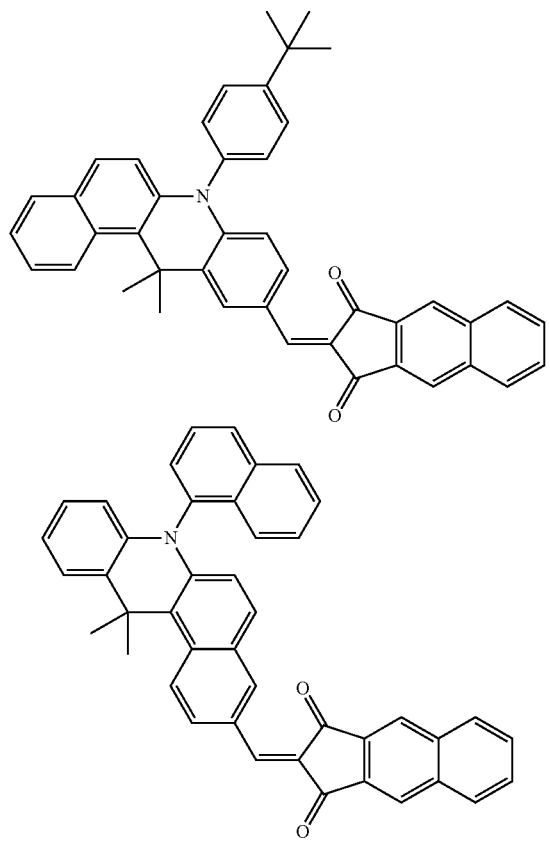

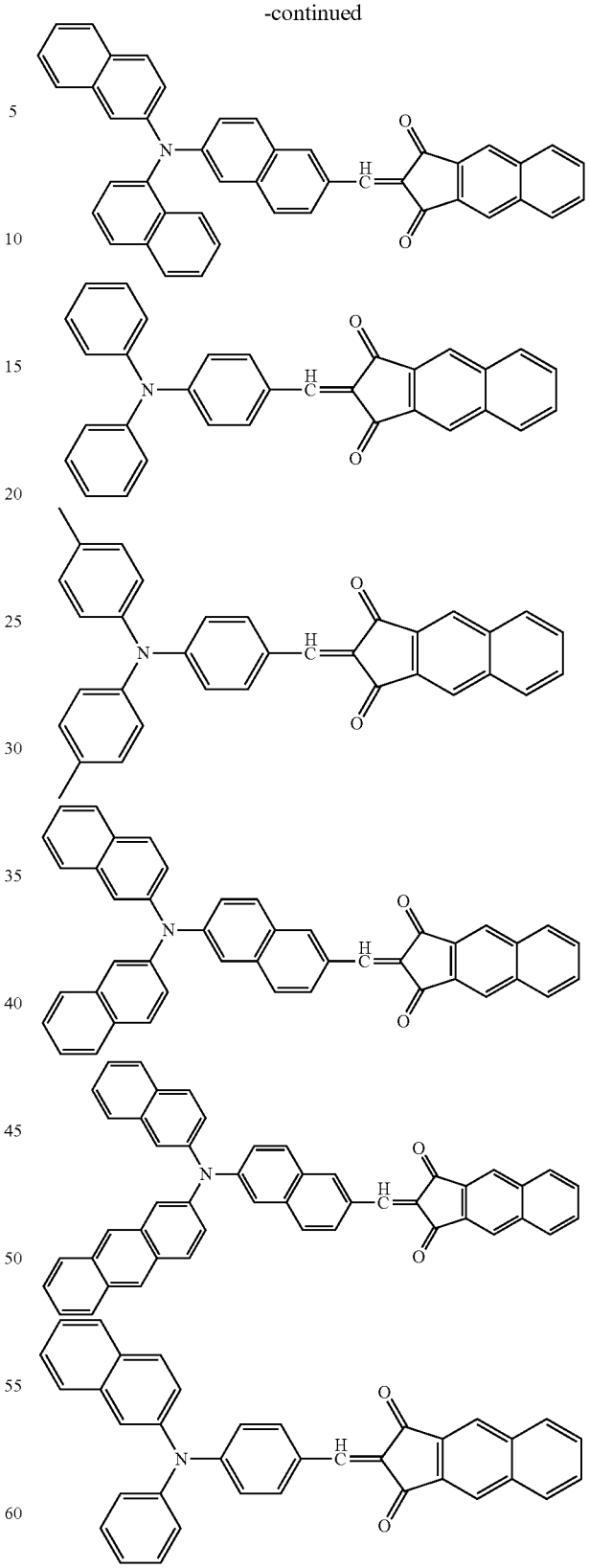

An electron donating organic material may be used in the electron blocking layer 107b. Specifically, an aromatic diamine compound such as N,N-bis(3-methylphenyl)-1,1'-biphenyl)-4,4'-diamine (TPD) or 4,4'-bis[N-(naphthyl)-N- phenyl-amino]biphenyl (α-NPD), a polyphirine compound such as oxazole, oxadiazole, triazole, imidazole, imidazolone, a stilbene derivative, a pyrazoline derivative, tetrahydroimidazole, polyarylalkane, butadiene, 4,4',4''-tris(N-(3-methylphenyl)N-phenylamino)triphenylamine(m-MTDATA), porphine, tetraphenylporphine, copper, phthalocyanine, copper phthalocyanine, and titanium phthalocyanineoxide, a triazole derivative, an oxadiazole derivative, an imidazole derivative, a polyarylalkane derivative, a pyrazoline derivative, a pyrazolone derivative, a phenylenediamine derivative, an anileamine derivative, an amino substituted calcone derivative, an oxazole derivative, a styrylanthracene derivative, a fluorenone derivative, a hydrazone derivative, and a silazane derivative may be used as a low molecular material, and a polymer such as phenylenevinylene, fluorene, carbazole, indole, pyrene, pyrrole, picholine, thiophene, acetylene, and diacetylene or a derivative thereof may be used as a polymer material. Any compound having a sufficient hole transport property may be used even though the compound is not an electron donating compound.

An inorganic material may be used as the electric charge blocking layer 107b. In general, the dielectric constant of an inorganic material is larger than that of an organic material, and therefore, when the inorganic material is used for the electron blocking layer 107b, a large quantity of voltage is applied to the photoelectric conversion layer 107a, thereby enabling to increase the photoelectric conversion efficiency. Examples of the material that may form the electric charge blocking layer 107b include calcium oxide, chromium oxide, chromiumcopper oxide, manganese oxide, cobalt oxide, nickel oxide, copper oxide, galliumcopper oxide, strontiumcopper oxide, niobium oxide, molybdenum oxide, indiumcopper oxide, indiumsilver oxide, iridium oxide and the like.

In the electric charge blocking layer 107b including a plurality of layers, among the plurality of layers, the layer adjacent to the photoelectric conversion layer 107a is preferably a layer containing the same material as the p-type organic semiconductor contained in the photoelectric conversion layer 107a. By using the same p-type organic semiconductor in the electron blocking layer 107b, the formation of mid-level at the interface of the layer adjacent to the photoelectric conversion layer 107a may be suppressed, and thus, dark current may be further suppressed.

In the case where the electric charge blocking layer 107b is a single layer, the layer may be formed of an inorganic material, and in the case where the electric charge blocking layer is formed of a plurality of layers, one or two or more layers may be formed of an inorganic material.

It is preferred to use compounds represented by the following Formula (1-A1) or Formula (1-A2) as a material used in the electric charge blocking layer 107b.

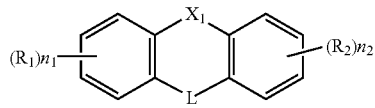

(1-A1)

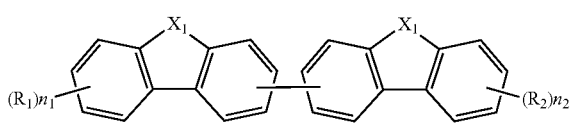

(1-A2)

In Formula (1-A1) and Formula (1-A2), $R_1$ and $R_2$ each independently represent a heterocyclic group that may be substituted by an alkyl group. $X_1$ and $X_2$ each independently represent a carbon atom, a nitrogen atom, an oxygen atom, a sulfur atom, and a silicon atom, and may further have a substituent. L may represents a single bond, an oxygen atom, a sulfur atom, an alkylene group, an alkenylene group, a cycloalkylene group, a cycloalkenylene group, an arylene group, a divalent heterocyclic group or an imino group, which may further have a substituent. $n_1$ and $n_2$ each independently represent an integer of 1 to 4.

The heterocyclic group represented by $R_1$ and $R_2$ may include a condensed ring formed of 2 to 5 single rings. Further, the number of carbon atoms is preferably 6 to 30, and more preferably 6 to 20.

In addition, the alkyl group that may be substituted by the heterocyclic group is preferably an alkyl group having 1 to 6 carbon atoms, and may be a straight- or branched-chained alkyl group, or a cycloalkyl group, and a ring (for example, a benzene ring) formed by bonding a plurality of alkyl groups, but preferably branched-chained alkyl group. Specific examples of the alkyl group may include a methyl group, an ethyl group, an isopropyl group, a t-butyl group, and a neopentyl group, and a t-butyl group is preferable.

L represents a single bond, an oxygen atom, a sulfur atom, an alkylene group, an alkenylene group, a cycloalkylene group, a cycloalkenylene group, an arylene group, a divalent heterocyclic group or an imino group. L is preferably a single bond, an alkylene group having 1 to 12 carbon atoms, an alkenylene group having 2 to 12 carbon atoms (for example, —CH$_2$=CH$_2$—), an arylene group having 6 to 14 carbon atoms (for example, a 1,2-phenylene group, and a 2,3-naphthylene group), a heterocyclic group having 4 to 13 carbon atoms, an oxygen atom, a sulfur atom, and an imino group (for example, a phenylimino group, a methylimino group, and a t-butylimino group) having a hydrocarbon group having 1 to 12 carbon atoms (preferably an aryl group or alkyl group), more preferably a single bond, an alkylene group having 1 to 6 carbon atoms (for example, a methylene group, a 1,2-ethylene group, and a 1,1-dimethylmethylene group), an oxygen atom, a sulfur atom, and an imino group having 1 to 6 carbon atoms, and particularly preferably a single bond or an alkylene group having 1 to 6 carbon atoms.

In the case where L represents an alkylene group, an alkenylene group, a cycloalkylene group, a cycloalkenylene group, an arylene group, a divalent heterocyclic group or an imino group, examples thereof may further have a substituent. Examples of the added substituent may include an alkyl group, a halogen atom, an aryl group, and a hetero ring.

Examples of the heterocyclic group that may be substituted by the alkyl group represented by $R_1$ and $R_2$ may include the following N1 to N15. N13 is preferable.

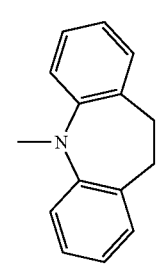

N1

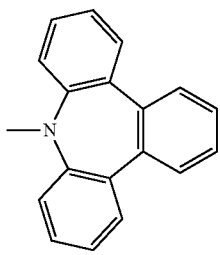 N2
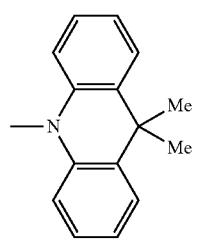 N3
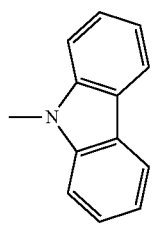 N4
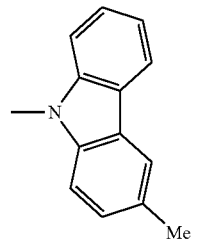 N5
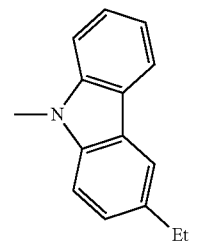 N6
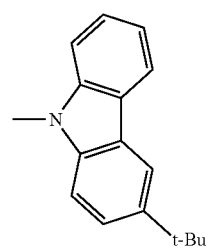 N7
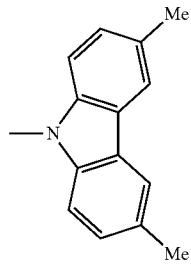 N8
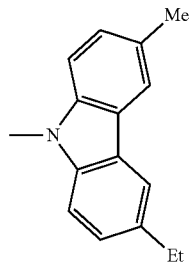 N9
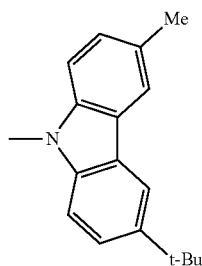 N10
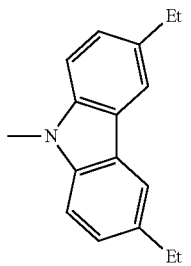 N11
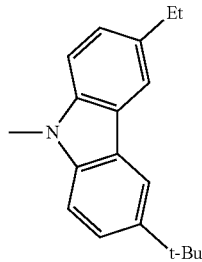 N12
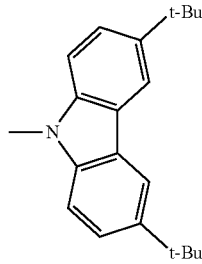 N13

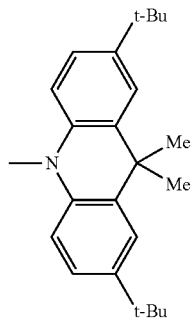

N14

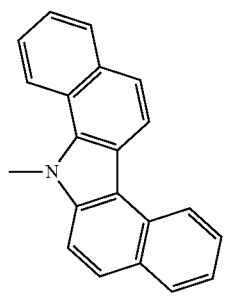

N15

An alkyl group or an aryl group is preferable as the substituent of $X_1$ and $X_2$.

The alkyl group is preferably an alkyl group having 1 to 4 carbon atoms, examples thereof may include a methyl group, an ethyl group, an n-propyl group, an isopropyl group or a t-butyl group, and a methyl group is more preferable.

The aryl group is preferably an aryl group having 6 to 20 carbon atoms. The aryl group may be substituted, and preferably an aryl group having 6 to 15 carbon atoms which may have an alkyl group having 1 to 4 carbon atoms. Examples thereof may include a phenyl group, a naphthyl group, an anthracenyl group, a 9-dimethylfluorenyl group, a methylphenyl group, a dimethylphenyl group and the like, and a phenyl group, a naphthyl group, an anthracenyl group and a 9-dimethylfluorenyl group are preferred.

Materials represented by the following Formulas are particularly preferred as the material of the electric charge blocking layer.

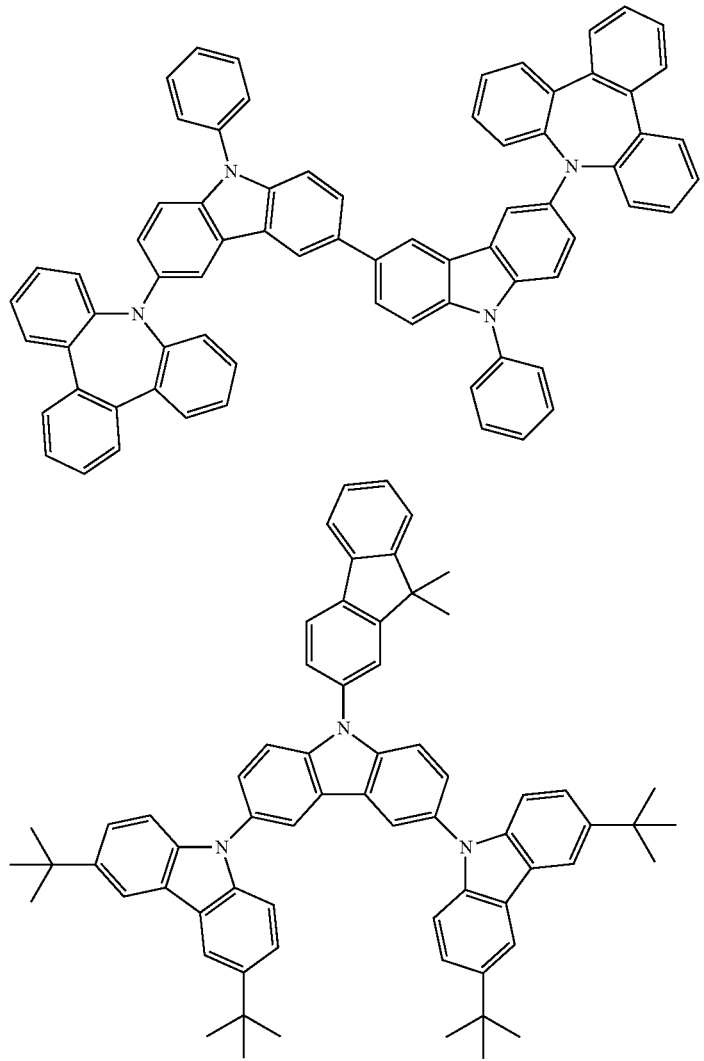

-continued
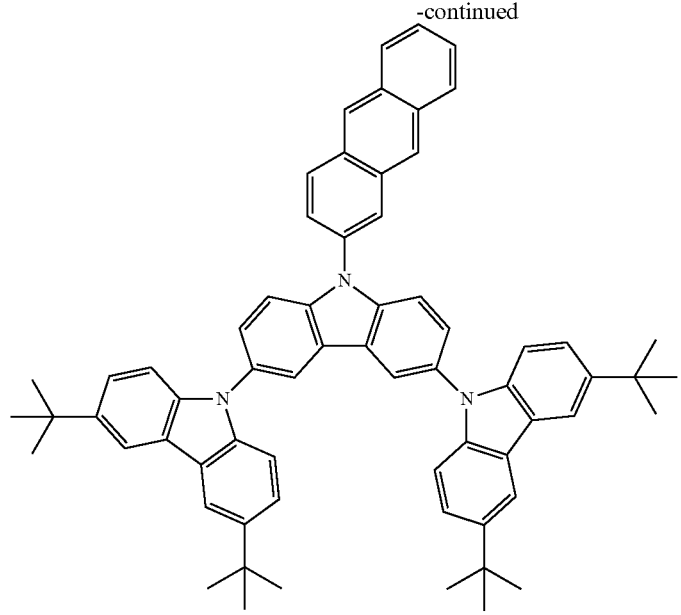
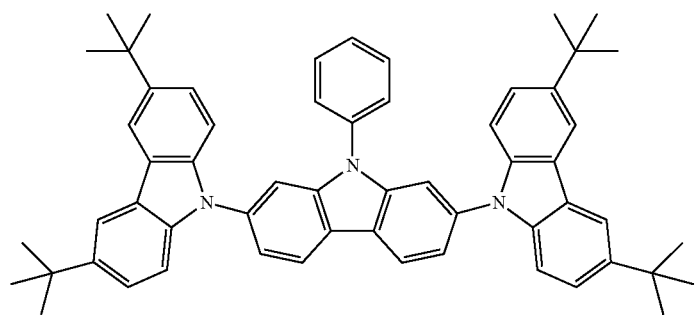
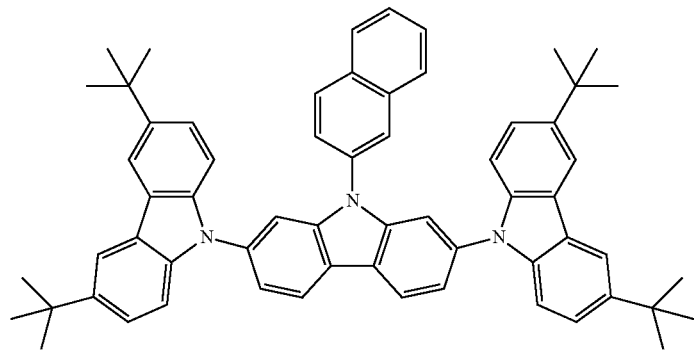
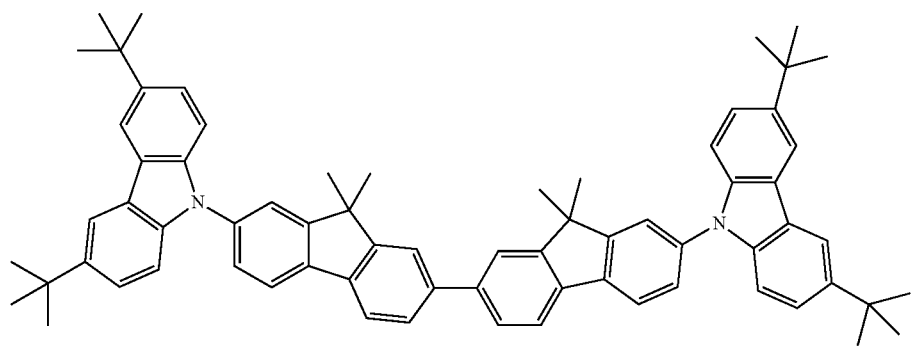

-continued
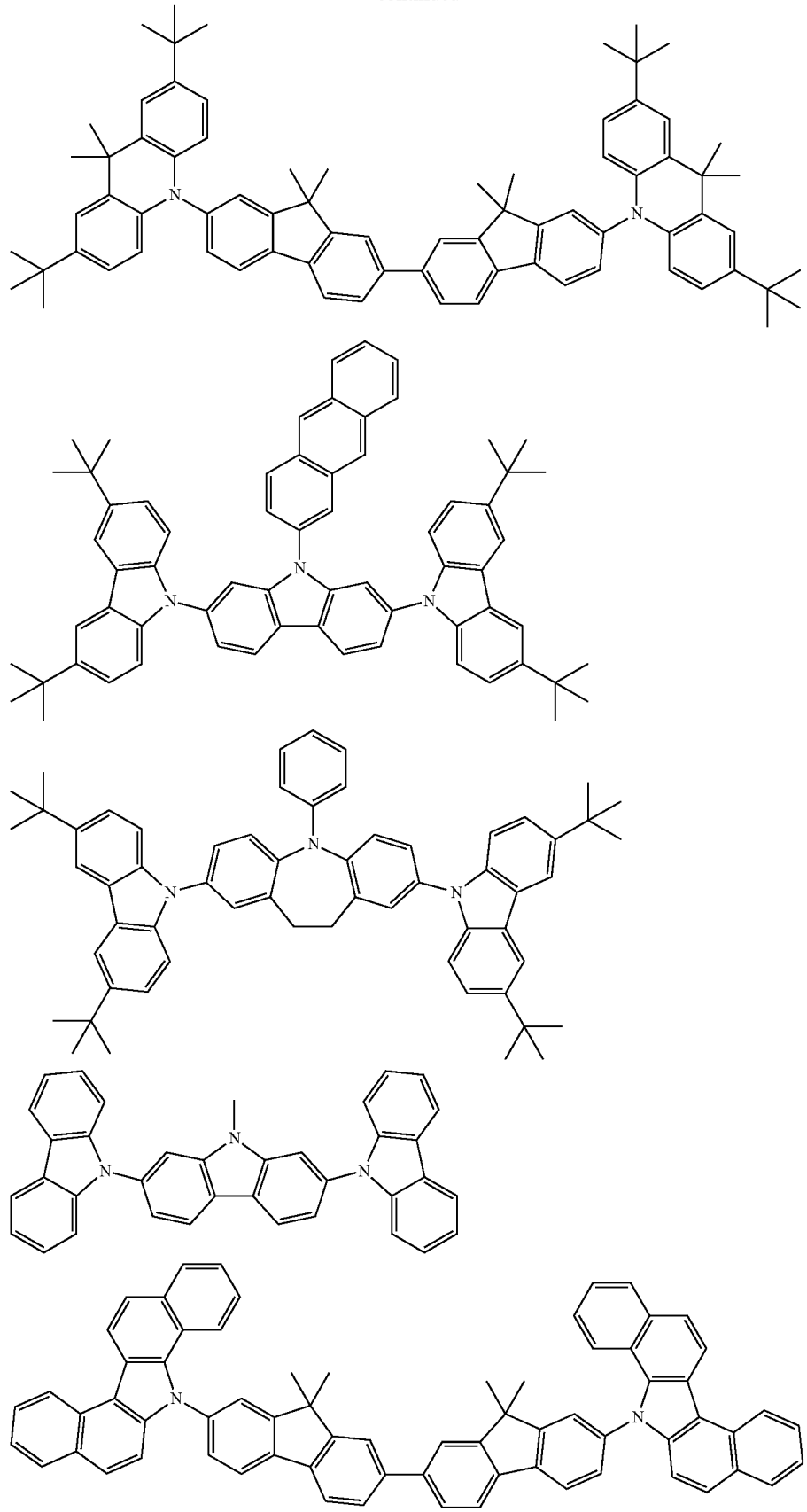

The solid-state imaging device 100 constituted as described above is manufactured as follows.

First, as illustrated in FIG. 1, the substrate 101 is provided with the dielectric layer 102 which includes the connection portion 105, 106, and the film of a material of the pixel electrode 104 is formed on the dielectric layer 102 of the substrate 101 by, for example, a sputtering method.

Next, patterning of the film of the pixel electrode material is performed by photolithography and etching so that the film of the pixel electrode material remains on the connection portion 106, 105, and then, a plurality of the pixel electrodes 104 and a plurality of the connection electrodes 103 are formed.

After forming the plurality of pixel electrodes 104 and the plurality of connection electrodes 103, a dielectric film is formed thereon and planarized to obtain the dielectric layer 102 illustrated in FIG. 2. It is preferred that the process up to this point is performed in a vacuum.

A photoelectric conversion device used in a solid-state imaging device is a small device, as compared to a solar cell. As the size of one pixel electrode is small, it is difficult to adopt a laser patterning as disclosed in Patent Document 5. Accordingly, in the present manufacturing method, the pixel electrode 104 is formed by photolithography and etching. Further, by forming the pixel electrode in a vacuum, foreign matters such as moisture and oxygen, which are factors in deteriorating a light receiving layer when forming an electrode, are prevented from being attached to the substrate.

Subsequently, the substrate 101 is heated at 270° C. or above. The heating of the substrate 101 may be performed either in a vacuum or in the atmosphere.

After the heating of the substrate 101 is completed, the light receiving layer 107, the counter electrode 108, the buffer layer 109, the sealing layer 110, the color filter 111 and the protection layer 114 are formed in this order to obtain the solid-state imaging device 100.

By the method, deterioration of the pixel electrode 104 in the heating process performed after the photoelectric conversion layer is formed can be prevented, and thus, heat resistance of the solid-state imaging device 100 is improved.

Hereinafter, the effects of the present invention will be described based on the examples.

EXAMPLES

Example 1

15 nm of Titanium oxide nitride (TiON) film was formed by a sputtering method on the CMOS substrate having a signal reading circuit, of which an $SiO_2$ dielectric film was formed on the surface (including a connection portion), and then, patterning of the film was performed by photolithography and dry etching to form a pixel electrode. The process up to this point was performed in a vacuum. Further, the pixel electrode was electrically connected to the signal reading circuit in the substrate through the connection portion in the dielectric film. Thereafter, the substrate was heated at 300° C. for 30 minutes in the atmosphere (substrate heating process).

Then, the following compound 2 was formed in a film thickness of 100 nm on the substrate by a vacuum thermal evaporation method to form an electron blocking layer. Thereafter, a film of the following compound 1 and $C_{60}$ was formed by co-deposition in a volume ratio of 1:2 to form a photoelectric conversion layer.

Subsequently, an ITO film was formed in a thickness of 10 nm by a sputtering method to form a counter electrode. Then, a film of alumina was formed in a thickness of 200 nm on the counter electrode by an ALCVD method to form a buffer layer. Thereafter, a film of silicon oxynitride was formed in a thickness of 100 nm on the buffer layer by a sputtering method to form a sealing layer. In this manner, the solid-state imaging device was manufactured having a constitution of up to a sealing layer as illustrated in FIG. 1

Examples 2 to 8

A solid-state imaging device was manufactured in the same manner as in Example 1, except that a material of the electron blocking layer, a material of the photoelectric conversion layer, a heating temperature in the substrate heating process and a material of the pixel electrode were changed as shown in Table 1 (also different from Example 1 in that in Examples 3 and 4, ITO was used as the pixel electrode material). With respect to the mark "/*" in the column of a constitution of the light receiving layer in Table 1,  represents an electron blocking layer and * represents a photoelectric conversion layer.

Comparative Example 1

A solid-state imaging device was manufactured in the same manner as in Example 1 except that the substrate heating process was omitted.

Comparative Examples 2 to 5

A solid-state imaging device was manufactured in the same manner as in Comparative example 1, except that a material of the electron blocking layer, a material of the photoelectric conversion layer and a material of the pixel electrode were changed as shown in Table 1 (also different from Comparative example 1 in that in Comparative example 2, ITO was used as the pixel electrode material).

Comparative Example 6

A solid-state imaging device was manufactured in the same manner as in Comparative example 1, except that a heating temperature in the substrate heating process was changed to 250° C.

Comparative Example 7

A solid-state imaging device was manufactured in the same manner as in Comparative example 1, except that a heating temperature in the substrate heating process was changed to 260° C.

| | Constitution of light receiving layer | Pixel electrode material | Substrate heating process | Concentration of oxygen in the thickness of 10 nm from the substrate side of pixel electrode (atm % to Ti) | | Concentration of nitride in the thickness of 10 nm from the substrate side of pixel electrode (atm % to Ti) | | Concentration of oxygen in the entire pixel electrode (atm % to Ti) | | Concentration of nitride in the entire pixel electrode (atm % to Ti) | | Dark current density after annealing at 220° C. (a relative value when the value immediately after manufacturing each device is 1) |
|---|---|---|---|---|---|---|---|---|---|---|---|---|
| | | | | At the time of forming electrode | After substrate heating process | At the time of forming electrode | After substrate heating process | At the time of forming electrode | After substrate heating process | At the time of forming electrode | After substrate heating process | |
| Ex. 1 | Compound 2/ Compound 1 + $C_{60}$ | TiON | 300° C. 30 min. | 29% | 46% | 101% | 87% | 70% | 88% | 83% | 71% | 0.48 |
| Ex. 2 | Compound 2/ Compound 1 + $C_{60}$ | TiON | 350° C. 30 min. | 29% | 71% | 101% | 75% | 70% | 107% | 83% | 61% | 0.47 |
| Ex. 3 | Compound 2/ Compound 1 + $C_{60}$ | ITO | 300° C. 30 min. | — | — | — | — | — | — | — | — | 1.00 |
| Ex. 4 | Compound 2/ Compound 1 + $C_{60}$ | ITO | 350° C. 30 min. | — | — | — | — | — | — | — | — | 0.56 |
| Ex. 5 | Compound 3/ Compound 1 + $C_{60}$ | TiON | 300° C. 30 min. | 29% | 46% | 101% | 87% | 70% | 88% | 83% | 71% | 0.43 |
| Ex. 6 | Compound 2/ Compound 4 + $C_{60}$ | TiON | 300° C. 30 min. | 29% | 46% | 101% | 87% | 70% | 88% | 83% | 71% | 0.94 |
| Ex. 7 | Compound 2/ Compound 5 + $C_{60}$ | TiON | 300° C. 30 min. | 29% | 46% | 101% | 87% | 70% | 88% | 83% | 71% | 0.30 |
| Ex. 8 | Compound 2/ Compound 1 + $C_{60}$ | TiON | 280° C. 30 min. | 29% | 41% | 101% | 88% | 70% | 81% | 83% | 72% | 0.57 |
| Comp. Ex. 1 | Compound 2/ Compound 1 + $C_{60}$ | TiON | none | 29% | — | 101% | — | 70% | — | 83% | — | 3.44 |
| Comp. Ex. 2 | Compound 2/ Compound 1 + $C_{60}$ | ITO | none | — | — | — | — | — | — | — | — | 24.6 |
| Comp. Ex. 3 | Compound 3/ Compound 1 + $C_{60}$ | TiON | none | 29% | — | 101% | — | 70% | — | 83% | — | 3.33 |
| Comp. Ex. 4 | Compound 2/ Compound 4 + $C_{60}$ | TiON | none | 29% | — | 101% | — | 70% | — | 83% | — | 4.18 |
| Comp. Ex. 5 | Compound 2/ Compound 5 + $C_{60}$ | TiON | none | 29% | — | 101% | — | 70% | — | 83% | — | 3.13 |
| Comp. Ex. 6 | Compound 2/ Compound 1 + $C_{60}$ | TiON | 250° C. 30 min. | 29% | 34% | 101% | 92% | 70% | 72% | 83% | 76% | 2.02 |
| Comp. Ex. 7 | Compound 2/ Compound 1 + $C_{60}$ | TiON | 260° C. 30 min. | 29% | 36% | 101% | 92% | 70% | 73% | 83% | 74% | 1.61 |

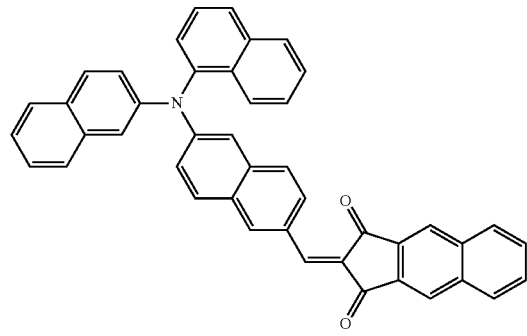

Compound 1

-continued

| | | | Concentration of oxygen in the thickness of 10 nm from the substrate side of pixel electrode (atm % to Ti) | | Concentration of nitride in the thickness of 10 nm from the substrate side of pixel electrode (atm % to Ti) | | Concentration of oxygen in the entire pixel electrode (atm % to Ti) | | Concentration of nitride in the entire pixel electrode (atm % to Ti) | | Dark current density after annealing at 220° C. (a relative value when the value immediately |
|---|---|---|---|---|---|---|---|---|---|---|---|
| Constitution of light receiving layer | Pixel electrode material | Substrate heating process | At the time of forming electrode | After substrate heating process | At the time of forming electrode | After substrate heating process | At the time of forming electrode | After substrate heating process | At the time of forming electrode | After substrate heating process | after manufacturing each device is 1) |

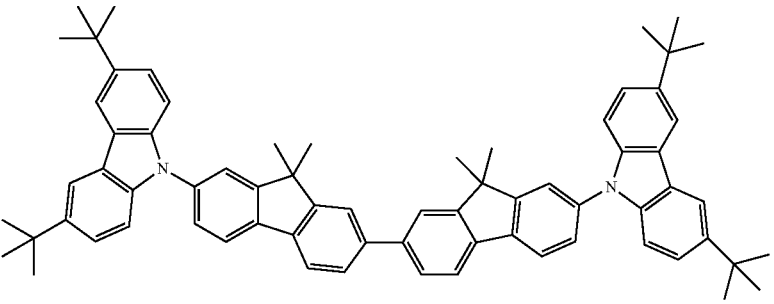

Compound 2

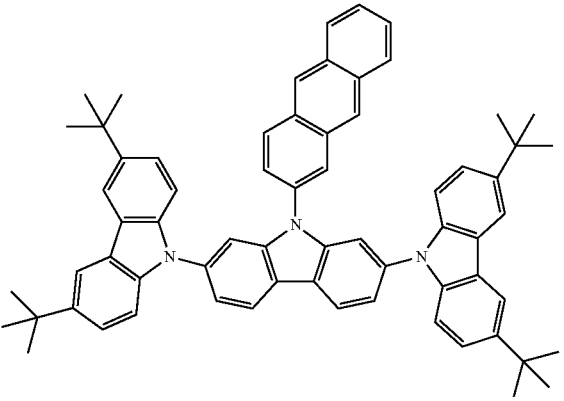

Compound 3

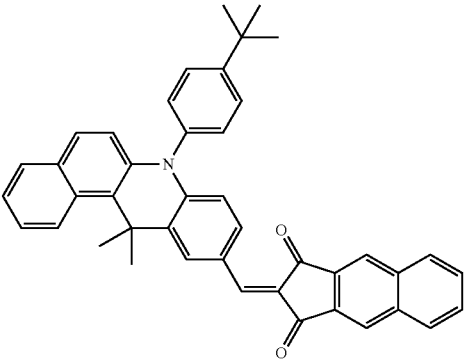

Compound 4

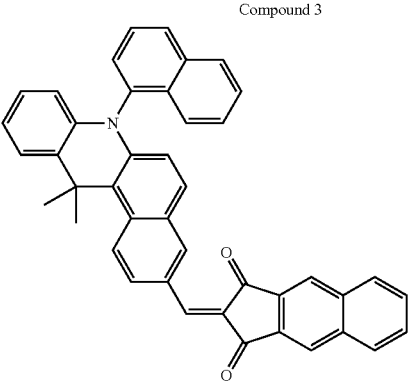

Compound 5

With respect to the photoelectric conversion device in Examples 1, 2 and 5 to 8, and in Comparative examples 6 and 7, the composition of the pixel electrode before and after the substrate heating process before forming the light receiving layer was measured. With respect to the photoelectric conversion device in Comparative examples 1 and 3 to 5, the composition of the pixel electrode before forming the light receiving layer was measured. The results are shown in Table 1 for reference.

Further, with respect to all solid-state imaging devices, a dark current density was measured by applying an electric field of $2.0 \times 10^5$ V/cm to the side of the pixel electrode in minus direction. The dark current density was measured in each case after completing the manufacture of a solid-state imaging device and after heating the solid-state imaging device at 220° C. for 30 minutes, which is the same temperature as in the heating process performed later. The results measured after the heating were shown in Table 1 as a relative value to the results measured before the heating.

As shown in Table 1, the solid-state imaging device in Examples 1 to 8 had a lower dark current density by performing the heating process, as compared with the solid-state imaging device in Comparative examples 1 to 5 in which the substrate heating process was omitted, and it can be understood that heat resistance is improved by the substrate heating process.

Further, the dark current was substantially decreased in Example 8 where the pixel electrode is heated at 280° C., as compared with Comparative example 7 where the pixel electrode is heated at 260° C. From the result, it can be seen that heat resistance can be improved when performing the heating of pixel electrode at the temperature of 270° C. or above.

The amount of oxygen in the pixel electrode measured for the solid-state imaging device in Comparative examples 6 and 7 was increased no more than 10% before and after the substrate heating process. Meanwhile, in Examples 1, 2 and 5 to 8, the amount of oxygen was increased as much as 10% or more. From the result, it can be assumed that in the case of a pixel electrode formed of TiON, the amount of oxygen in the pixel electrode is increased by 10% or more by performing the substrate heating process, and as a result, the increase in the amount of oxygen in the pixel electrode during the heating process is prevented, thereby preventing deterioration of the pixel electrode.

Further, the above Examples only show the data in the case of heating the pixel electrode for 30 minutes, but the same effect could be obtained even though the heating time was changed.

As described above, the following is disclosed in the present specification.

The present invention relates to a method for manufacturing a photoelectric conversion device which includes: a first electrode in which a dielectric film composed of an oxide film is formed on a substrate, the first electrode including a conductive material formed on the dielectric film; a light receiving layer that includes an organic material formed on the first electrode; and a second electrode which is formed on the light receiving layer, in which the method includes: a first process for forming the first electrode on the dielectric film; a second process for forming the light receiving layer on the first electrode; a third process for forming the second electrode on the light receiving layer; and a heating process for heating the substrate at 270° C. or above, the heating process performed before the second process and after the first process.

In the method for manufacturing the photoelectric conversion device, the first process includes: a film forming process of a conductive material on the dielectric layer; and a patterning process of a formed film of the conductive material.

In the method for manufacturing the photoelectric conversion device, the patterning process is performed in a vacuum.

In the method for manufacturing the photoelectric conversion device, the patterning process is performed by photolithography and etching.

In the method for manufacturing the photoelectric conversion device, the light receiving layer includes: an electric charge blocking layer that includes an organic material; and a photoelectric conversion layer that includes an organic layer.

In the method for manufacturing the photoelectric conversion device, the conductive material is ITO or TiON.

In the method for manufacturing the photoelectric conversion device, the conductive material is TiON, and atomic % of an oxygen amount contained in the first electrode to a titanium amount is increased by 10% or more before and after the heating process.

A solid-state imaging device includes: a photoelectric conversion device manufactured by the method for manufacturing the photoelectric conversion device; and a signal reading circuit formed on the substrate, the signal reading circuit capable of reading out the signal according to the quantity of electric charges collected in the first electrode.

The imaging apparatus includes the solid-state imaging device.

INDUSTRIAL APPLICABILITY

According to the present invention, there may be provided a method for manufacturing a photoelectric conversion device having a light receiving layer that includes an organic material, in which heat resistance can be improved irrespective of a material of a light receiving layer. Further, there may be provided a solid-state imaging device having a photoelectric conversion device manufactured by the manufacturing method, and an imaging apparatus having the solid-state imaging device.

The present invention has been described in detail with reference to specific embodiments, but it is apparent to the person with ordinary skill in the art that various changes or modifications may be made without departing from the spirit and the scope of the present invention.

The present application is based on Japanese Patent Application (Patent Application No. 2010-216104) filed on Sep. 27, 2010, and Japanese Patent Application (Patent Application No. 2011-169649) filed on Aug. 2, 2011, and the contents of which are incorporated herein by reference.

EXPLANATION OF REFERENCE NUMERALS

100: Solid-state imaging device
101: Substrate
102: Dielectric layer
104: Pixel electrode
107: Light receiving layer
100: Counter electrode

The invention claimed is:

1. A method for manufacturing a photoelectric conversion device which comprises: a first electrode containing a conductive material, the first electrode formed on a dielectric film composed of an oxide film, which is formed on a substrate; a light receiving layer which includes an organic material formed on the first electrode; and a second electrode formed on the light receiving layer,
   wherein the method for manufacturing the photoelectric conversion device comprises:
      a first process for forming the first electrode on the dielectric film;
      a second process for forming the light receiving layer on the first electrode;
      a third process for forming the second electrode on the light receiving layer; and
      a heating process for heating the substrate at 270° C. or above, the heating process performed before the second process and after the first process.

2. The method for manufacturing the photoelectric conversion device of claim 1,
   wherein the first process comprises:
      a film forming process of a conductive material on the dielectric film; and
      a patterning process of a formed film of the conductive material.

3. The method for manufacturing the photoelectric conversion device of claim 2,
   wherein the patterning process is performed in a vacuum.

4. The method for manufacturing the photoelectric conversion device of claim 2,
wherein the patterning process is performed by photolithography and etching.

5. The method for manufacturing the photoelectric conversion device of claim 1,
wherein the light receiving layer includes: an electric charge blocking layer that includes an organic material; and a photoelectric conversion layer that includes an organic layer.

6. The method for manufacturing the photoelectric conversion device of claim 1,
wherein the conductive material is ITO or TiON.

7. The method for manufacturing the photoelectric conversion device of claim 6,
wherein the conductive material is TiON, and
atomic % of an oxygen amount contained in the first electrode to a titanium amount is increased by 10% or more before and after the heating process.

8. A solid-state imaging device comprising:
the photoelectric conversion device manufactured by the method for manufacturing the photoelectric conversion device of claim 1; and
a signal reading circuit formed on the substrate, the signal reading circuit capable of reading out the signal according to a quantity of electric charges collected in the first electrode.

9. An imaging apparatus comprising the solid-state imaging device of claim 8.

* * * * *